(12) United States Patent
Yan et al.

(10) Patent No.: US 11,679,444 B2
(45) Date of Patent: Jun. 20, 2023

(54) COOLING SYSTEM FOR A REFLOW FURNACE

(71) Applicant: Illinois Tool Works Inc., Glenview, IL (US)

(72) Inventors: Shenghu Yan, Suzhou (CN); Peng Shu, Suzhou (CN); Dong Zhang, Suzhou (CN)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 17/271,461

(22) PCT Filed: Aug. 27, 2019

(86) PCT No.: PCT/US2019/048370
§ 371 (c)(1),
(2) Date: Feb. 25, 2021

(87) PCT Pub. No.: WO2020/046959
PCT Pub. Date: Mar. 5, 2020

(65) Prior Publication Data
US 2021/0346969 A1 Nov. 11, 2021

(30) Foreign Application Priority Data
Aug. 29, 2018 (CN) .......................... 201810993604.9

(51) Int. Cl.
*B23K 1/008* (2006.01)
*B23K 3/08* (2006.01)
(Continued)

(52) U.S. Cl.
CPC .............. *B23K 3/085* (2013.01); *B23K 1/008* (2013.01); *F27B 9/3005* (2013.01);
(Continued)

(58) Field of Classification Search
CPC ... B23K 1/008; B23K 3/085; F27B 2009/126; F27B 9/028; F27B 9/3005; F27B 9/3077;
(Continued)

(56) References Cited

U.S. PATENT DOCUMENTS 4,938,410 A * 7/1990 Kondo ................... B23K 1/008
228/180.1
5,345,061 A * 9/1994 Chanasyk .............. B23K 1/008
219/400

(Continued)

FOREIGN PATENT DOCUMENTS

CN 201793673 4/2011
CN 102049587 5/2011
(Continued)

OTHER PUBLICATIONS

Int'l Search Report and Written Opinion Appln No. PCT/US2019/048370, dated Oct. 10, 2019.
(Continued)

*Primary Examiner* — Erin B Saad
*Assistant Examiner* — Carlos J Gamino
(74) *Attorney, Agent, or Firm* — McAndrews Held & Malloy, Ltd.

(57) ABSTRACT

Disclosed in the present application is a cooling system for a reflow furnace, the reflow furnace comprising a heating zone, and the cooling system being used to regulate a temperature of the heating zone, the cooling system comprising: at least one gas inlet and at least one gas discharge port, the at least one gas inlet and the at least one gas discharge port being disposed on the heating zone; a blowing apparatus; at least one gas intake pipeline, an inlet of the at least one gas intake pipeline being connected to the blowing apparatus, an outlet of the at least one gas intake pipeline being connected to the at least one gas inlet, the at least one (Continued)

gas intake pipeline being able to controllably establish fluid communication between the blowing apparatus and the at least one gas inlet; and at least one gas discharge pipeline, an inlet of the at least one gas discharge pipeline being connected to the at least one gas discharge port, an outlet of the at least one gas discharge pipeline being connected to the outside, and the at least one gas discharge pipeline being able to controllably establish fluid communication between the at least one gas discharge port and the outside. The cooling system of the present application can shorten the time taken for the reflow furnace to change from a higher heating temperature to a lower heating temperature.

12 Claims, 7 Drawing Sheets

(51) Int. Cl.
  *F27B 9/30* (2006.01)
  *F27B 9/40* (2006.01)
  *F27B 9/12* (2006.01)
  *H05K 3/34* (2006.01)

(52) U.S. Cl.
  CPC .............. *F27B 9/3077* (2013.01); *F27B 9/40* (2013.01); *F27B 2009/126* (2013.01); *H05K 3/3494* (2013.01)

(58) Field of Classification Search
  CPC .. F27B 9/40; F27D 17/004; F27D 2009/0078; H05K 2203/111; H05K 3/3494
  See application file for complete search history.

(56) References Cited

U.S. PATENT DOCUMENTS

| | | | | |
|---|---|---|---|---|
| 5,440,101 A | * | 8/1995 | Cox | H05K 13/02 34/212 |
| 5,579,981 A | * | 12/1996 | Matsumura | B23K 1/008 228/19 |
| 6,120,585 A | * | 9/2000 | Inomata | B23K 1/012 96/377 |
| 6,146,448 A | * | 11/2000 | Shaw | B23K 1/008 55/467 |
| 6,576,030 B2 | | 6/2003 | Mullins | |
| 7,581,668 B2 | * | 9/2009 | Bell | H05K 3/3494 228/230 |
| 8,328,551 B2 | * | 12/2012 | Orbeck | B23K 1/008 432/128 |
| 8,418,743 B2 | * | 4/2013 | Kurihara | B23K 1/012 164/183 |
| 10,576,567 B2 | * | 3/2020 | Diepstraten | B23K 3/08 |
| 2001/0055740 A1 | * | 12/2001 | Bloom | B23K 1/012 432/247 |
| 2002/0178705 A1 | * | 12/2002 | Mullins | B23K 1/008 55/385.2 |
| 2003/0218058 A1 | * | 11/2003 | Shaw | B23K 1/012 228/230 |
| 2019/0234342 A1 | * | 8/2019 | Saito | B01D 5/009 |
| 2021/0180867 A1 | * | 6/2021 | Wang | F27D 21/04 |
| 2021/0197304 A1 | * | 7/2021 | Wang | B23K 3/04 |
| 2021/0339330 A1 | * | 11/2021 | Yan | B23K 35/383 |

FOREIGN PATENT DOCUMENTS

| | | | |
|---|---|---|---|
| CN | 102229015 | | 11/2011 |
| CN | 103079739 | | 5/2013 |
| CN | 103648700 | | 3/2014 |
| CN | 105174257 | | 12/2015 |
| CN | 106017109 | | 10/2016 |
| CN | 106695048 | | 5/2017 |
| CN | 207139050 | | 3/2018 |
| CN | 207907718 | * | 9/2018 |
| CN | 210172742 | * | 3/2020 |
| CN | 210718617 | * | 6/2020 |
| EP | 0999007 | | 5/2000 |

OTHER PUBLICATIONS

Taiwan Office Action with search report Appln No. 108125163 dated Dec. 9, 2022.

* cited by examiner

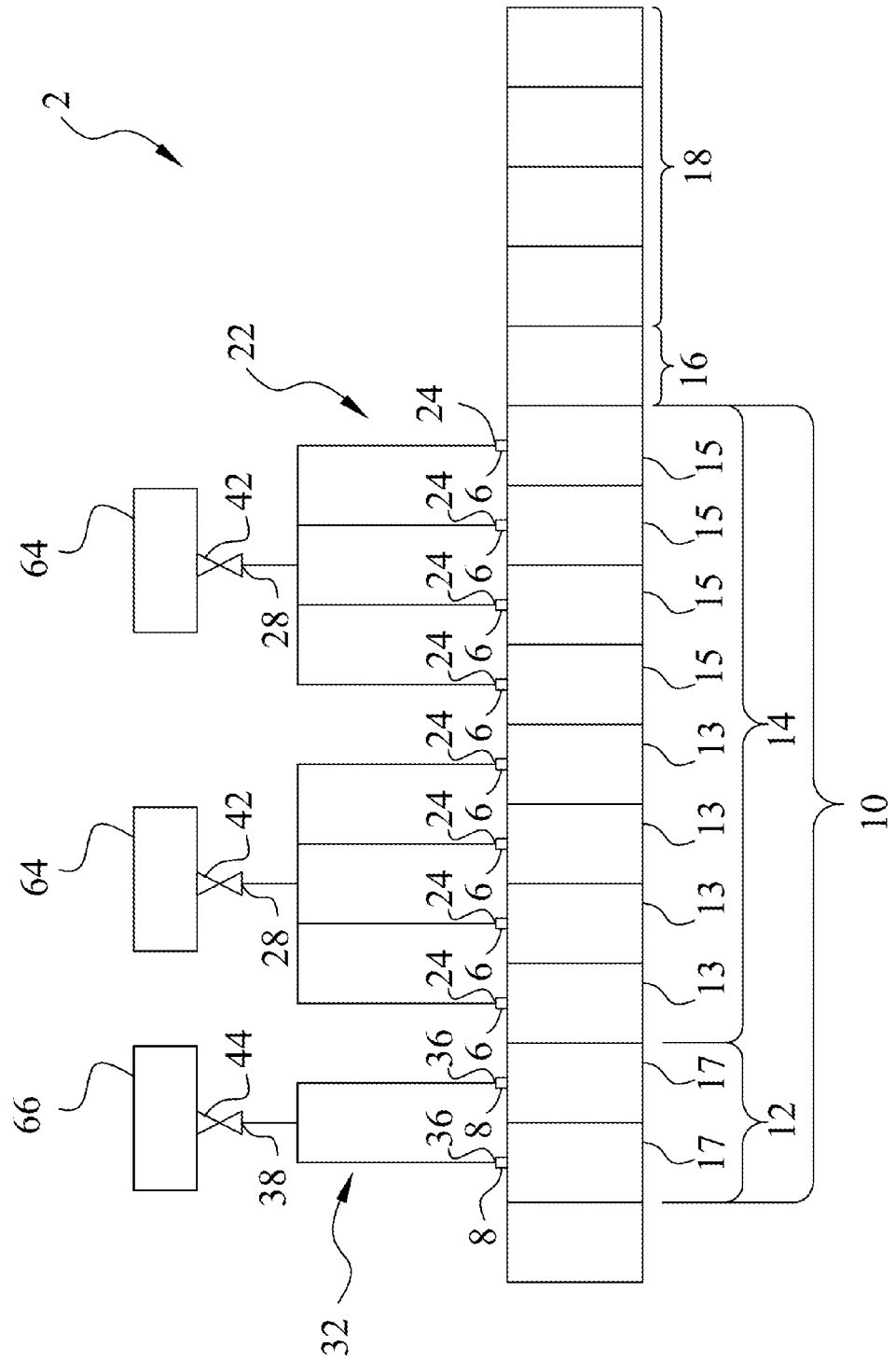

COOLING SYSTEM FOR A REFLOW FURNACE

RELATED APPLICATIONS

This application is a national stage application under 35 U.S.C. § 371 of PCT Application Serial No. PCT/US2019/48370, filed on Aug. 27, 2019, and entitled "A COOLING SYSTEM FOR A REFLOW FURNACE," and claims priority to Chinese Patent Application Serial No. 201810993604.9, filed Aug. 29, 2018. The entireties of PCT Application Serial No. PCT/US2019/48370 and Chinese Patent Application Serial No. 201810993604.9 are incorporated herein by reference.

TECHNICAL FIELD

The present application relates to the field of reflow furnaces, in particular to a cooling system for a reflow furnace.

BACKGROUND

In a reflow furnace, different circuit boards need different heating temperatures in order to deposit solder paste (e.g. tin paste) in selected regions on the circuit board. Thus, the reflow furnace must provide different heating temperatures for different circuit boards.

The present application provides a reflow furnace cooling system, to shorten the time taken for the reflow furnace to change from a higher heating temperature to a lower heating temperature.

SUMMARY

Demonstrative embodiments of the present application can solve at least some of the abovementioned problems. For example, the present application provides a cooling system for a reflow furnace, the reflow furnace comprising a heating zone, and the cooling system being used to regulate a temperature of the heating zone, characterized in that the cooling system comprises: at least one gas inlet and at least one gas discharge port, the at least one gas inlet and the at least one gas discharge port being disposed on the heating zone; a blowing apparatus; at least one gas intake pipeline, an inlet of the at least one gas intake pipeline being connected to the blowing apparatus, an outlet of the at least one gas intake pipeline being connected to the at least one gas inlet, the at least one gas intake pipeline being able to controllably establish fluid communication between the blowing apparatus and the at least one gas inlet; and at least one gas discharge pipeline, an inlet of the at least one gas discharge pipeline being connected to the at least one gas discharge port, an outlet of the at least one gas discharge pipeline being connected to the outside, and the at least one gas discharge pipeline being able to controllably establish fluid communication between the at least one gas discharge port and the outside.

According to the cooling system described above, the at least one gas intake pipeline is multiple gas intake pipelines, and the at least one gas inlet is multiple gas inlets; the inlet of each of the multiple gas intake pipelines is connected to the blowing apparatus, the outlet of each of the multiple gas intake pipelines is connected to a corresponding one of the multiple gas inlets, and each of the multiple gas intake pipelines can controllably establish fluid communication between the blowing apparatus and a corresponding one of the multiple gas inlets.

According to the cooling system described above, the heating zone comprises a colder zone and a hotter zone, the at least one gas inlet being disposed at the hotter zone, and the at least one gas discharge port being disposed at the colder zone.

According to the cooling system described above, the outlet of the at least one gas discharge pipeline can be used for connecting to an exhaust apparatus, the at least one gas discharge pipeline can controllably connect the at least one gas discharge port to the exhaust apparatus, and the exhaust apparatus can be used for discharging gas in the reflow furnace to the outside.

According to the cooling system described above, the blowing apparatus comprises a fan.

According to the cooling system described above, the blowing apparatus comprises multiple fans, each of the multiple gas inlets being controllably connected to a corresponding one of the multiple fans.

According to the cooling system described above, the cooling system further comprises at least one gas intake valve apparatus, disposed between the at least one gas inlet and the blowing apparatus.

According to the cooling system described above, the at least one gas intake valve apparatus is disposed on at least one gas intake pipeline.

According to the cooling system described above, the at least one gas intake valve apparatus is disposed between the at least one gas inlet and the outlet of the at least one gas intake pipeline.

According to the cooling system described above, the at least one gas intake valve apparatus is disposed between the blowing apparatus and the inlet of the at least one gas intake pipeline.

According to the cooling system described above, the cooling system further comprises at least one gas discharge valve apparatus, disposed between the inlet of the at least one gas discharge pipeline and the at least one gas discharge port.

According to the cooling system described above, the cooling system further comprises a control system, used to control the blowing apparatus and at least one gas intake valve apparatus.

According to the cooling system described above, the cooling system further comprises a temperature detection apparatus, used to detect the temperature of the heating zone; the control system being able to control the blowing apparatus and at least one gas intake valve apparatus according to the temperature detected by the temperature detection apparatus.

The cooling system of the present application can accelerate the cooling of the heating zone in the reflow furnace, in order to shorten the time taken for the reflow furnace to change from a higher heating temperature to a lower heating temperature.

BRIEF DESCRIPTION OF THE DRAWINGS

These and other features and advantages of the present application can be better understood by reading the following detailed explanation with reference to the accompanying drawings; throughout the drawings, identical drawing labels indicate identical components, wherein:

FIGS. 1B-1C are simplified system diagrams of cooling systems in two other embodiments of the present application.

DETAILED DESCRIPTION

Figure 1A:
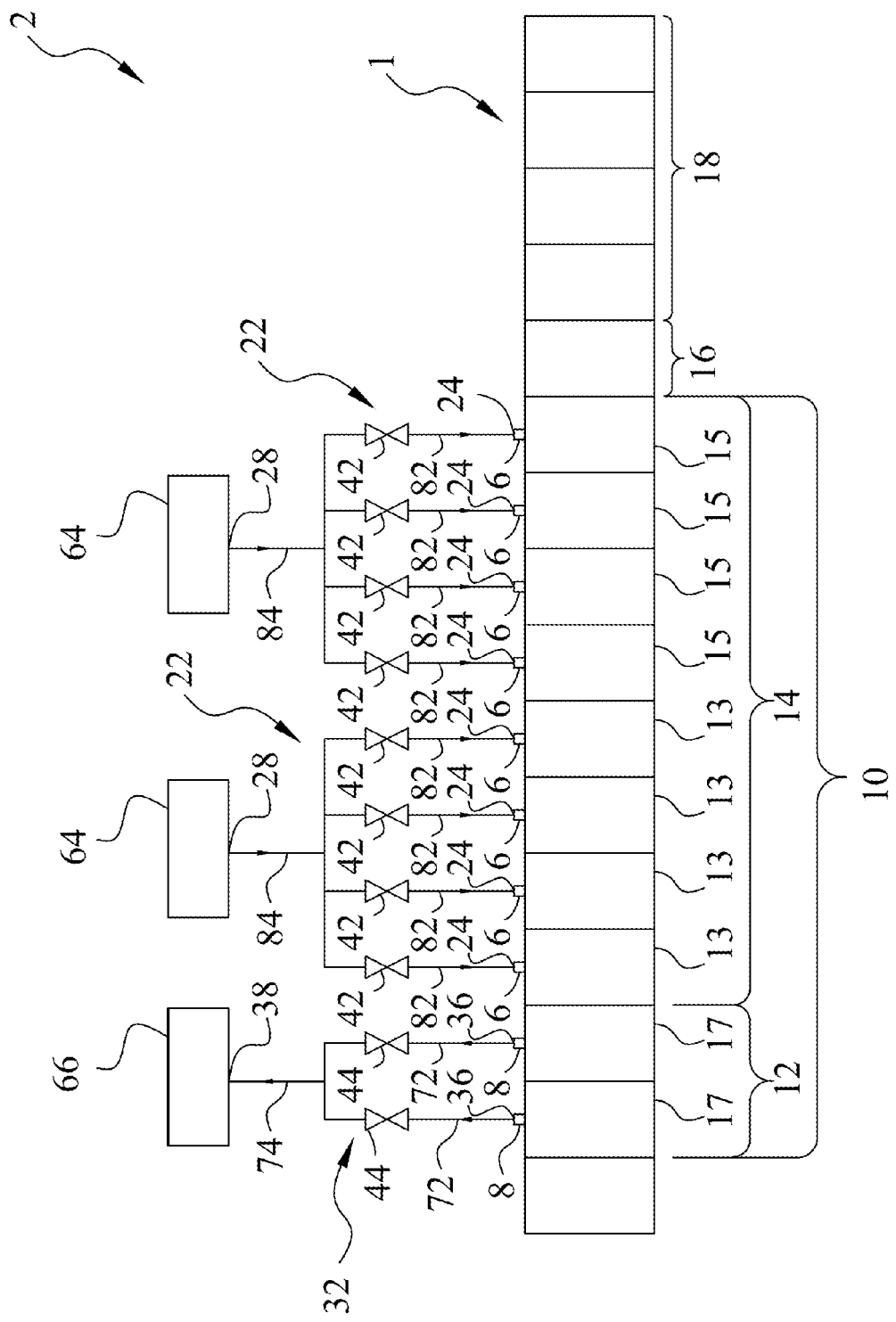
FIG. 1A is a simplified system diagram of a cooling system in an embodiment of the present application.

Various particular embodiments of the present application are described below with reference to the accompanying drawings, which form part of this Description. In the drawings below, identical drawing numerals are used for identical components, and similar drawing numerals are used for similar components.

FIG. 1A is a simplified system diagram of a cooling system 2 in an embodiment of the present application. As shown in FIG. 1A, the cooling system 2 comprises a reflow furnace 1. The reflow furnace 1 comprises a heating zone 10, a separating gas discharge zone 16 and a cooling zone 18. The separating gas discharge zone 16 is disposed between the heating zone 10 and the cooling zone 18, and used to separate the heating zone 10 and the cooling zone 18 when the reflow furnace 1 is operating, in order to prevent the transmission of heat of the heating zone 10 into the cooling zone 18. A hearth (not shown) runs through the heating zone 10, the separating gas discharge zone 16 and the cooling zone 18; the heating zone 10, the separating gas discharge zone 16 and the cooling zone 18 are all in fluid communication with the hearth. The heating zone 10 and the cooling zone 18 may each comprise multiple sub-regions, each of the sub-regions being in fluid communication with each other. In the embodiment shown in FIG. 1A, the heating zone 10 comprises ten sub-regions. The ten sub-regions comprise a colder zone 12 and a hotter zone 14. The temperature of the hotter zone 14 is higher than the temperature of the colder zone 12. The colder zone 12 comprises two preheating zones 17. The hotter zone 14 comprises four even temperature zones 13 and four peak value zones 15. The preheating zones 17, the even temperature zones 13 and the peak value zones 15 are arranged adjacently. In the preheating zones 17 and the even temperature zones 13, a circuit board can be heated gradually, and a portion of flux in solder paste on the circuit board will be gasified. In the peak value zone 15, the circuit board continues to be heated, and the solder paste melts. The circuit board then passes through the separating gas discharge zone 16 and is then conveyed into the cooling zone 18. The cooling zone 18 comprises four sub-regions. In the cooling zone 18, the solder paste is cooled in soldering regions of the circuit board and cures, thereby connecting electronic elements to the circuit board. Each sub-region in the heating zone 10 is provided with a communication port. Specifically, each sub-region of the colder zone 12 is provided with a gas discharge port 8, for discharging gas contained in the colder zone 12 out of the reflow furnace 1. Each sub-region in the hotter zone 14 is provided with a gas inlet 6, for causing gas to enter the reflow furnace 1.

The cooling system 2 further comprises two gas intake pipelines 22 and two blowing apparatuses 64. Each of the two gas intake pipelines 22 comprises one branch gas intake inlet pipe 84 and four branch gas intake outlet pipes 82. One end of one branch gas intake inlet pipe 84 is connected to one end of each of four branch gas intake outlet pipes 82. Another end of the branch gas intake inlet pipe 84 is an inlet 28, for connecting to a corresponding one of the blowing apparatuses 64. Another end of each of four branch gas intake outlet pipes 82 is an outlet 24, for connecting to a corresponding one of four gas inlets 6. Specifically, each of four outlets 24 in one gas intake pipeline 22 is connected to a corresponding gas inlet 6 in the four even temperature zones 13. Each of four outlets 24 in the other gas intake pipeline 22 is connected to a corresponding gas inlet 6 in the four peak value zones 15. The cooling system 2 further comprises eight gas intake valve apparatuses 42. Each of the eight gas intake valve apparatuses 42 is disposed on a corresponding one of the eight branch gas intake outlet pipes 82.

The cooling system 2 further comprises a gas discharge pipeline 32 and an exhaust apparatus 66. The gas discharge pipeline 32 comprises two branch gas discharge inlet pipes 72 and one branch gas discharge outlet pipe 74; one end of each of the two branch gas discharge inlet pipes 72 is connected to one end of the branch gas discharge outlet pipe 74. Another end of each of the two branch gas discharge inlet pipes 72 is an inlet 36, for connecting to a corresponding one of the two gas discharge ports 8 of the two colder zones 12. Another end of the branch gas discharge outlet pipe 74 is an outlet 38, for connecting to the exhaust apparatus 66. The cooling system 2 further comprises two gas discharge valve apparatuses 44. Each of the two gas discharge valve apparatuses 44 is disposed on a corresponding one of the two branch gas discharge inlet pipes 72.

The arrows in FIG. 1A show the flow direction of air in the pipelines when the blowing apparatuses 64, the exhaust apparatus 66, the gas intake valve apparatuses 42 and the gas discharge valve apparatuses 44 are all open.

Figure 1B:
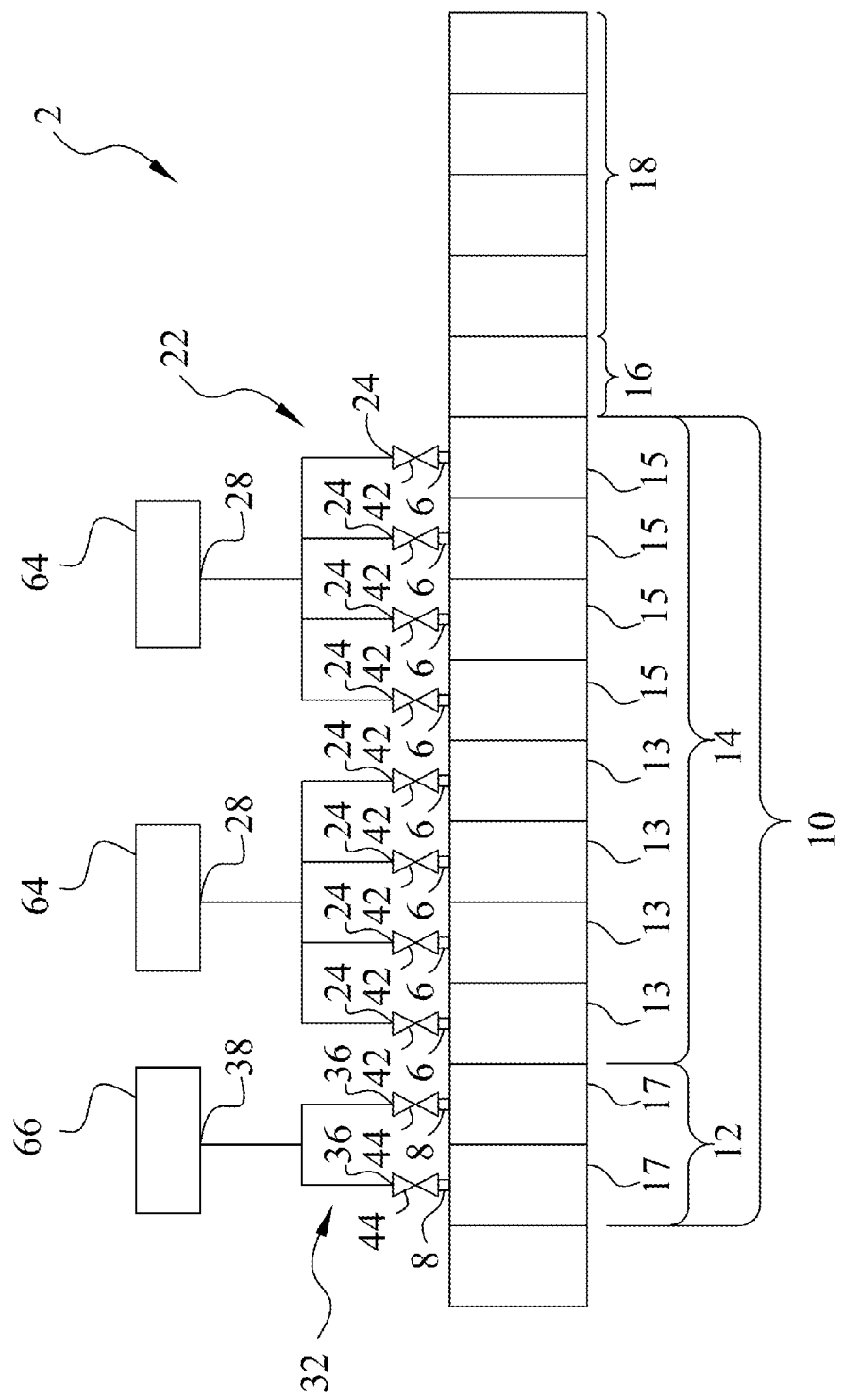

FIGS. 1B-1C are simplified system diagrams of cooling systems 2 in two other embodiments of the present application, and are intended to show different positions of arrangement of the gas intake valve apparatuses 42 and the gas discharge valve apparatus(es) 44. Apart from the positions of arrangement of the gas intake valve apparatuses 42 and the gas discharge valve apparatus(es) 44 being different, the disposition of other components is the same as in FIG. 1A in each case, so is not described again superfluously here. As shown in FIG. 1B, in one embodiment, the gas intake valve apparatus 42 is disposed between the outlet 24 of the gas intake pipeline 22 and the gas inlet 6; the gas discharge valve apparatus 44 is disposed between the inlet 36 of the gas discharge pipeline 32 and the gas discharge port 8. As shown in FIG. 10, in another embodiment, the gas intake valve apparatus 42 is disposed between the inlet 28 of the gas intake pipeline 22 and the blowing apparatus 64; the gas discharge valve apparatus 44 is disposed between the outlet 38 of the gas discharge pipeline 32 and the exhaust apparatus 66.

Figure 2:
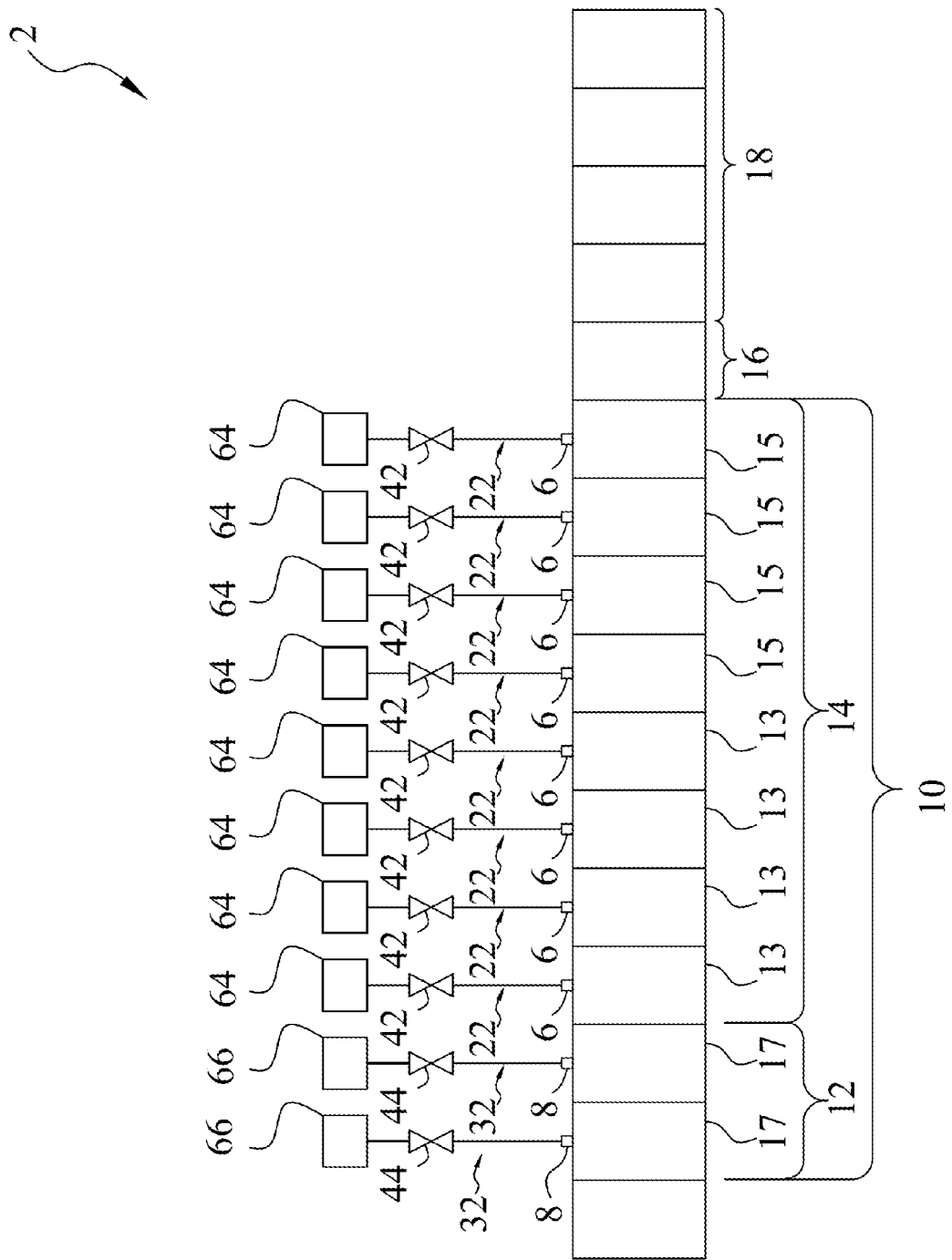
FIG. 2 is a simplified system diagram of a cooling system in another embodiment of the present application.

FIG. 2 is a simplified system diagram of a cooling system 2 in another embodiment of the present application, and is intended to show a different manner of arranging gas intake pipelines 22, blowing apparatuses 64, gas discharge pipelines 32 and exhaust apparatuses 66 in the cooling system 2. As shown in FIG. 2, the cooling system 2 comprises eight gas intake pipelines 22, eight blowing apparatuses 64 and eight gas intake valve apparatuses 42. Each of the eight blowing apparatuses 64 is connected to a corresponding one of eight gas inlets 6 via a corresponding one of the eight gas intake pipelines 22. Each of the eight gas intake valve apparatuses 42 is disposed on a corresponding one of the eight gas intake pipelines 22. The cooling system 2 further comprises two gas discharge pipelines 32, two exhaust apparatuses 66 and two gas discharge valve apparatuses 44. Each of the two exhaust apparatuses 66 is connected to a corresponding one of two gas discharge ports 8 via a corresponding one of the two gas discharge pipelines 32. Each of the two gas discharge valve apparatuses 44 is disposed on a corresponding one of the two gas discharge pipelines 32.

Those skilled in the art will understand that the number of sub-regions in the heating zone 10 and the cooling zone 18 of the reflow furnace 1, and the number of sub-regions in the colder zone 12 and the hotter zone 14, etc., can change according to the product to be soldered, and are not limited to the embodiments shown in FIGS. 1A-2. It must also be explained that the gas intake pipeline 22, the blowing apparatus 64, the gas discharge pipeline 32 and the exhaust apparatus 66 can change according to the setting of the reflow furnace 1, and are not restricted in terms of quantity or manner of connection, only being required to lead air into and out of the hearth and accelerate the flow of air in the hearth.

Figure 3:
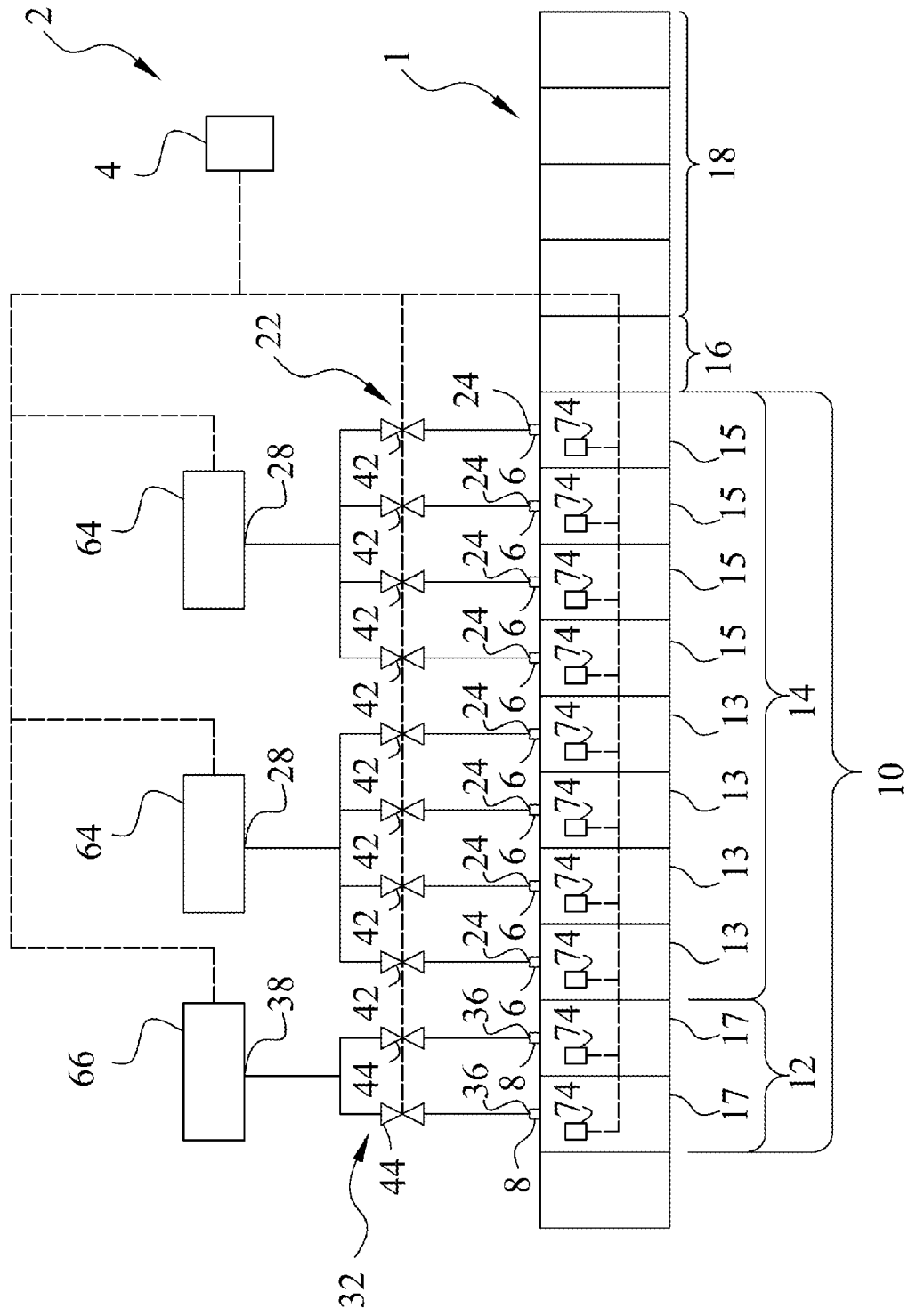
FIG. 3 is a schematic diagram of a control component and control connections of the cooling system shown in FIG. 1A.

FIG. 3 is a schematic diagram of a control component (comprising a control apparatus 4) and control connections of the cooling system 2 shown in FIG. 1A. As shown in FIG. 3, the cooling system 2 further comprises the control apparatus 4 and a temperature detection apparatus. The temperature detection apparatus is configured to be used for detecting the temperature in each sub-region in the heating zone 10. As an example, the temperature detection apparatus comprises ten temperature sensors 74. The control apparatus 4 is configured to be able to control the blowing apparatuses 64, the exhaust apparatus 66, the gas discharge valve apparatuses 44 and the gas intake valve apparatuses 42 according to the temperatures detected by the temperature sensors 74. The control apparatus 4 is in communicative connection with the blowing apparatuses 64, the exhaust apparatus 66, the gas discharge valve apparatuses 44 and the gas intake valve apparatuses 42.

Figure 4:
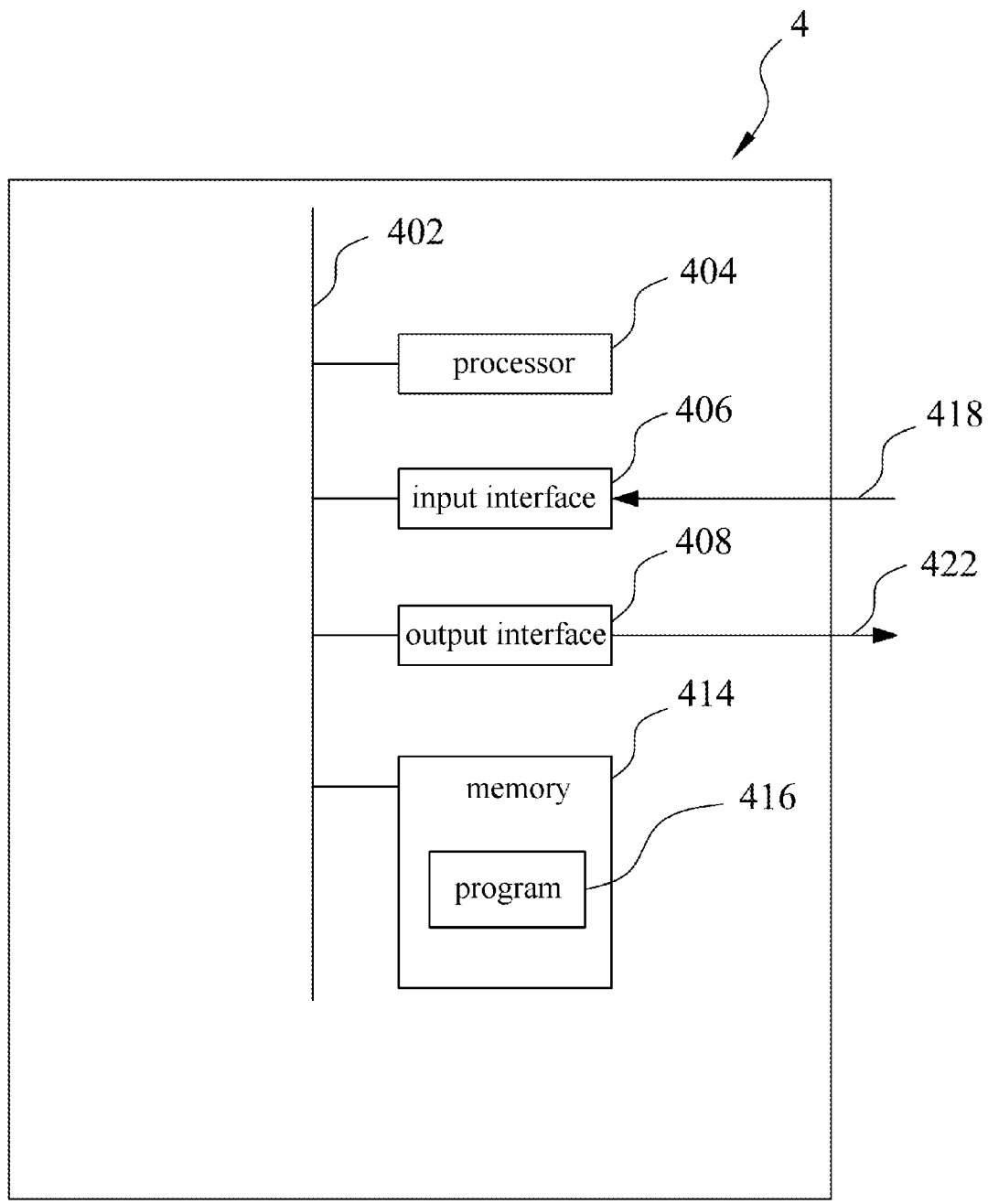
FIG. 4 is a simplified schematic diagram of one embodiment of the control apparatus in FIG. 3.

FIG. 4 is a simplified schematic diagram of one embodiment of the control apparatus 4 in FIG. 3. As shown in FIG. 4, the control apparatus 4 comprises a bus 402, a processor 404, an input interface 406, an output interface 408, and a memory 414 having a control program 416. All of the components in the control apparatus 4, including the processor 404, the input interface 406, the output interface 408 and the memory 414, are in communicative connection with the bus 402, such that the processor 404 is able to control the operation of the input interface 406, the output interface 408 and the memory 414. Specifically, the memory 414 is used for storing programs, instructions and data; the processor 404 reads programs, instructions and data from the memory 414, and can write data into the memory 414.

The input interface 406 receives signals and data from outside via a connecting line 418, including signals and data sent from the temperature sensors 74. The output interface 408 transmits control signals to the outside via a connecting line 422, including the transmission of opening and closing control signals to the blowing apparatuses 64, the exhaust apparatus 66, the gas discharge valve apparatuses 44 and the gas intake valve apparatuses 42. The control program and data such as a preset temperature target set value are stored in the memory 414 of the control apparatus 4. Various parameters may be preset in a production manufacturing project, or set during use by manual input or data import.

Figure 5:
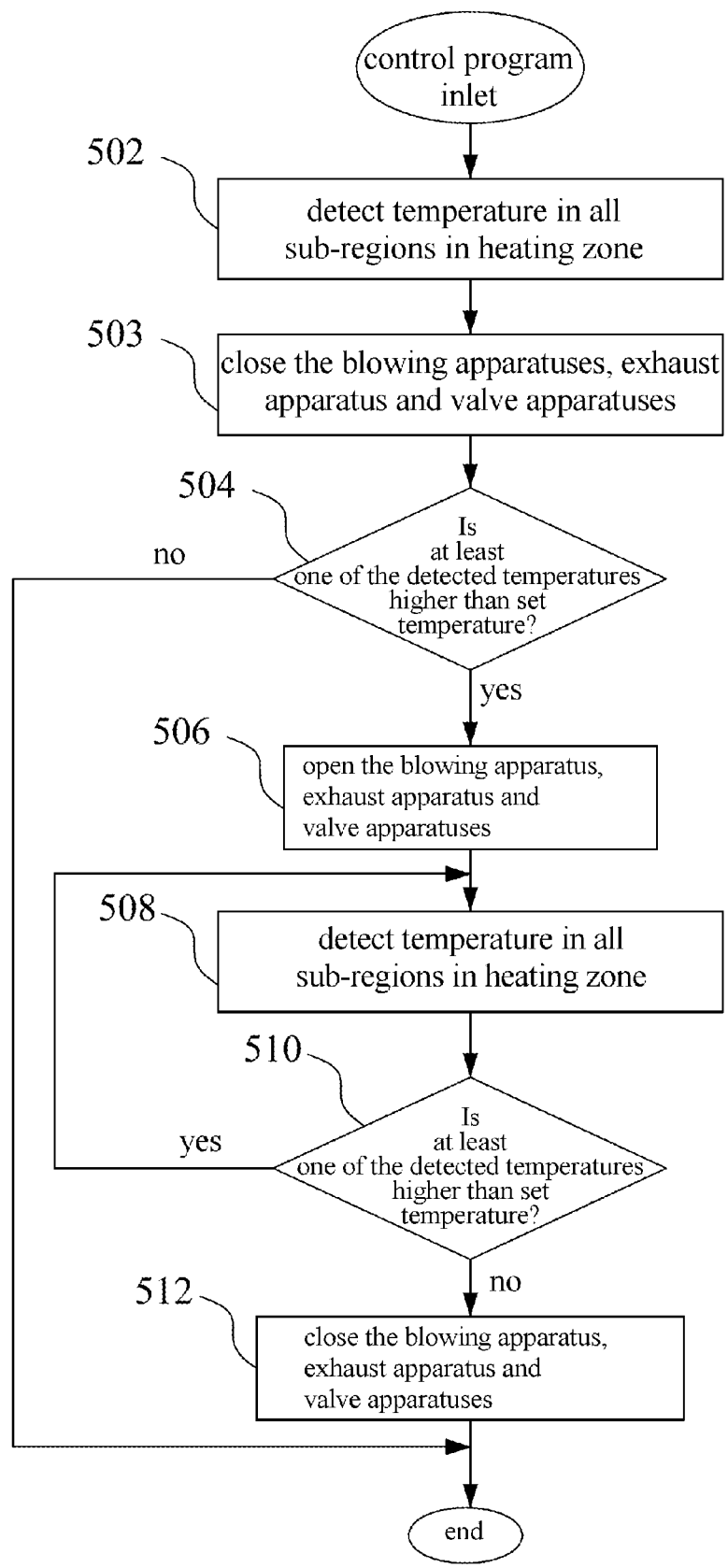
FIG. 5 is a schematic diagram of the procedure by which the control apparatus subjects the reflow furnace shown in FIG. 1A to temperature control.

FIG. 5 is a schematic diagram of the procedure by which the control apparatus 4 subjects the reflow furnace 1 shown in FIG. 1A to temperature control. A program of the flow chart shown in FIG. 5 is stored in the memory 414 of the control apparatus 4; the temperature control procedure is intended to regulate the temperature of each sub-region in the heating zone 10. For example, when soldering of a circuit board of a first type which needs to be heated to a higher temperature has ended, a circuit board of a second type which needs to be heated to a lower temperature will be soldered. At this time, the reflow furnace 1 must be cooled; activation of the cooling system 2 can accelerate the cooling of the reflow furnace 1. During cooling, the reflow furnace 1 is not operational. A set temperature of each sub-region is preset according to different soldering process requirements, and stored in the memory 414. When the temperature of at least one of the sub-regions of the heating zone 10 is higher than the set temperature of this sub-region, by activating the blowing apparatus 64 connected to the gas intake pipeline 22 corresponding to this sub-region, the gas intake valve apparatus 42 of the gas intake pipeline 22 corresponding to this sub-region, the exhaust apparatus 66 and the gas discharge valve apparatus 44, air at a lower temperature in the environment is rapidly conveyed into the hearth, thereby rapidly lowering the temperature of this sub-region, and reducing the time needed to wait for the reflow furnace 1 to cool.

As shown in FIG. 5, in step 502, the temperature sensors 74 detect the temperatures of all of the sub-regions in the heating zone 10. The processor 404 then shifts operation to step 503.

In step 503, the processor 404 closes the gas intake valve apparatuses 42, blowing apparatuses 64, gas discharge valve apparatuses 44 and exhaust apparatus 66. The processor 404 then shifts operation to step 504.

In step 504, if the temperature of each sub-region is not higher than the set temperature, then the control procedure is ended; if the temperature of at least one sub-region is higher than the set temperature, the processor 404 shifts operation to step 506.

In step 506, the processor 404 opens the gas intake valve apparatus 42 corresponding to the sub-region higher than the set temperature, the blowing apparatus 64, the gas discharge valve apparatus 44 and the blowing apparatus 66. The processor 404 then shifts operation to step 508.

In step 508, the temperature sensors 74 detect the temperatures of all of the sub-regions in the heating zone 10. The processor 404 then shifts operation to step 510.

In step 510, if the temperature of at least one sub-region is higher than the set temperature, the processor 404 shifts operation to step 508; if the temperature of each sub-region is not higher than the set temperature, the processor 404 shifts operation to step 512.

In step 512, the processor 404 closes the gas intake valve apparatus 42, blowing apparatus 64, gas discharge valve apparatus 44 and exhaust apparatus 66. The processor 404 then ends the control procedure.

It must be explained that various changes may be made to the arrangement in the cooling system in the present application. Those skilled in the art will understand that the blowing apparatus 64 or the exhaust apparatus 66 may be a fan, but could also be another source of motive power. Those skilled in the art will also understand that it is also possible for no exhaust apparatus 66 to be disposed in the cooling system, with exhaust air being discharged into the environment (the outside) directly instead.

Although this text has merely illustrated and described some features of the present application, to a person skilled in the art, various improvements and changes are possible. Thus, it should be understood that the attached claims are intended to cover all of the abovementioned improvements and changes which fall within the scope of the substantive spirit of the present application.

What is claimed is:

1. A cooling system for regulating a temperature of a heating zone of a reflow furnace, wherein the cooling system comprises:
    a blowing apparatus;
    at least one gas inlet and at least one gas discharge port, the at least one gas inlet and the at least one gas discharge port being configured to be disposed on the heating zone;
    at least one gas intake pipeline, an inlet of the at least one gas intake pipeline being connected to the blowing apparatus, an outlet of the at least one gas intake pipeline being connected to the at least one gas inlet, the at least one gas intake pipeline being able to controllably establish fluid communication between the blowing apparatus and the at least one gas inlet;
    at least one gas discharge pipeline, an inlet of the at least one gas discharge pipeline being connected to the at least one gas discharge port, an outlet of the at least one gas discharge pipeline being connected to an outside of the reflow furnace, and the at least one gas discharge pipeline being able to controllably establish fluid communication between the at least one gas discharge port and the outside of the reflow furnace, wherein the heating zone comprises a colder zone and a hotter zone, the at least one gas inlet being disposed at the hotter zone, and the at least one gas discharge port being disposed at the colder zone, wherein the colder zone does not include a gas intake port; and
    a control apparatus configured to control the blowing apparatus, control at least one gas intake valve apparatus of the gas intake pipeline, and control at least one gas discharge valve apparatus, wherein the control apparatus is configured to control the gas intake valve apparatus to intake gas to the hotter zone via the at least one intake port and to control the gas discharge apparatus to discharge gas from the colder zone via the at least one gas discharge port.

2. The cooling system as claimed in claim 1, wherein:
    the at least one gas intake pipeline is multiple gas intake pipelines, and the at least one gas inlet is multiple gas inlets;
    the inlet of each of the multiple gas intake pipelines is connected to the blowing apparatus, the outlet of each of the multiple gas intake pipelines is connected to a corresponding one of the multiple gas inlets, and each of the multiple gas intake pipelines can controllably establish fluid communication between the blowing apparatus and a corresponding one of the multiple gas inlets.

3. The cooling system as claimed in claim 1, wherein:
    the blowing apparatus comprises a fan.

4. The cooling system as claimed in claim 1, wherein:
    the blowing apparatus comprises multiple fans, each of the multiple gas inlets being controllably connected to a corresponding one of the multiple fans.

5. The cooling system as claimed in claim 1, further comprising:
    the at least one gas intake valve apparatus, disposed between the at least one gas inlet and the blowing apparatus.

6. The cooling system as claimed in claim 5, wherein:
    the at least one gas intake valve apparatus is disposed on at least one gas intake pipeline.

7. The cooling system as claimed in claim 5, wherein:
    the at least one gas intake valve apparatus is disposed between the at least one gas inlet and the outlet of the at least one gas intake pipeline.

8. The cooling system as claimed in claim 5, wherein:
    the at least one gas intake valve apparatus is disposed between the blowing apparatus and the inlet of the at least one gas intake pipeline.

9. The cooling system as claimed in claim 1, wherein:
    the outlet of the at least one gas discharge pipeline can be used for connecting to an exhaust apparatus, the at least one gas discharge pipeline can controllably connect the at least one gas discharge port to the exhaust apparatus, and the exhaust apparatus can be used for discharging gas in the reflow furnace to the outside.

10. The cooling system as claimed in claim 1, further comprising:
    the at least one gas discharge valve apparatus, disposed between the inlet of the at least one gas discharge pipeline and the at least one gas discharge port.

11. The cooling system as claimed in claim 1, further comprising:
    a temperature detection apparatus, used to detect the temperature of the heating zone;
    the control apparatus being able to control the blowing apparatus and the at least one gas intake valve apparatus according to the temperature detected by the temperature detection apparatus.

12. The cooling system as claimed in claim 1, wherein the hotter zone does not include a gas discharge port.

* * * * *